United States Patent
Ng et al.

(10) Patent No.: US 6,514,423 B1
(45) Date of Patent: Feb. 4, 2003

(54) METHOD FOR WAFER PROCESSING

(75) Inventors: Kan-Yin Ng, Maryland Heights, MO (US); Brent Teasley, Silex, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/507,811

(22) Filed: Feb. 22, 2000

(51) Int. Cl.$^7$ ............................................ B29B 29/02
(52) U.S. Cl. ........................ 216/38; 216/53; 216/89; 216/99
(58) Field of Search .................. 216/2, 38, 52, 216/53, 88, 89, 99; 451/37

(56) References Cited

U.S. PATENT DOCUMENTS

| | | | |
|---|---|---|---|
| 4,054,010 A | 10/1977 | Shipman | 51/55 |
| 4,588,473 A | 5/1986 | Hisatomi et al. | |
| 5,429,711 A | 7/1995 | Watanabe et al. | 216/52 |
| 5,447,890 A | 9/1995 | Kato et al. | 437/249 |
| 5,509,850 A | 4/1996 | Morioka et al. | 451/168 |
| 5,516,706 A | 5/1996 | Kusakabe | 437/12 |
| 5,569,063 A | 10/1996 | Morioka et al. | 451/296 |
| 5,766,065 A | 6/1998 | Hasegawa et al. | 451/173 |
| 5,855,735 A * | 1/1999 | Takada et al. | 216/88 |
| 5,899,743 A | 5/1999 | Kai et al. | |
| 5,928,066 A | 7/1999 | Hasegawa et al. | 451/173 |

FOREIGN PATENT DOCUMENTS

| | | |
|---|---|---|
| EP | 0 617 456 A2 | 9/1994 |
| EP | 0 764 976 A1 | 3/1997 |
| JP | 9-298172 | 11/1997 |
| WO | WO 99/09588 | 2/1999 |

OTHER PUBLICATIONS

E. Mendel and P. Sullivan; Reduction of Grinding and Lapping Defects, IBM Technical Disclosure Bulletin, vol. 25, No. 9, Feb. 1983.

* cited by examiner

*Primary Examiner*—Allan Olsen
(74) *Attorney, Agent, or Firm*—Senniger, Powers, Leavitt & Roedel

(57) ABSTRACT

A method for processing a semiconductor wafer to reduce surface roughness. The wafer has two flat, opposite faces with a peripheral edge extending around a circumference of the wafer between the faces. The method includes, in the following order, the steps of burnishing the edge, and etching the edge. The step of burnishing is defined by a relative rubbing motion between the edge and an abrasive appliance to remove damage from the edge, the rubbing motion occurring free from any polishing solution or chemical slurry. The step of etching includes exposing the wafer to a liquid chemical etchant for a period of time to remove additional damage from the edge. The method may also include, before the other steps, a step of lapping at least one face of the wafer to remove semiconductor matter through a relative rubbing motion between the face and an abrasive lapping plate in the presence of an abrasive liquid slurry.

16 Claims, 1 Drawing Sheet

METHOD FOR WAFER PROCESSING

BACKGROUND OF THE INVENTION

This invention relates generally to semiconductor wafer processing, and in particular to a method for preparing peripheral edges of wafers that employs mechanical burnishing.

Semiconductor wafers are generally prepared from a single crystal ingot, such as a silicon ingot, which is sliced into individual wafers. Each wafer is subjected to a number of processing operations to facilitate the installation of integrated circuit devices and to improve their yield, performance, and reliability. Typically, these operations reduce the thickness of the wafer, remove damage caused by the slicing operation, and reduce surface roughness.

Each wafer must undergo processing not only on at least one of its flat, facial surfaces but also along its peripheral edge or rim. Typically, each wafer is shaped along its edge with a grinding tool to remove square corners and to form a desired edge cross-section profile. That grinding causes substantial micro-crack and chip damage. During subsequent handling and processing, edges receive impact forces and relatively high local stresses that produce additional fractures, pits, and roughness. If left in place, these imperfections permit nucleation of damage to the crystal lattice. They increase the likelihood that slips and dislocations will grow and potentially ruin the wafer. Further, edge roughness tends to facilitate adherence of impurities, such as dust particles and inorganic anions, that can diffuse from the edge to facial surfaces where they detrimentally contaminate the wafer. Accordingly, the edge of each wafer must be smoothed to remove imperfections or reduce their size.

One method that is widely used in wafer processing to smooth surfaces is chemical-mechanical polishing. It generally involves rubbing a wafer with a soft polishing pad, such as a polyurethane impregnated polyester felt, while dispensing a polishing solution, or slurry. The slurry contains an abrasive and chemicals, such as a colloidal silica and an alkaline etchant, so that both mechanical action and chemical reaction contribute to the removal of material. The results are wafer surfaces that are flat, highly reflective, and damage-free. However, there are drawbacks to chemical-mechanical polishing. Polishing machines are relatively expensive. The slurry also has a high cost, and it is typically a toxic, alkaline fluid. It requires careful handling by operators and introduces problems relating to safe environmental waste treatment and disposal.

Although chemical-mechanical polishing is crucial for wafer facial surfaces, it is not absolutely necessary along edges because the required standard for smoothness is not as stringent. Nevertheless, many edge smoothing methods are based on chemical-mechanical edge polishing, and they bring the associated drawbacks of cost and complexity. Edge polishing takes substantial time and is a hindrance to achieving high throughput in the processing of wafers.

As an alternative to polishing, wafer edges have been burnished to smooth edge surfaces. Burnishing comprises rubbing an abrasive appliance along the edge to remove surface layers of semiconductor material. A stream of liquid water is typically provided to cool the wafer and eliminate abraded material, but there is no polishing solution or chemical slurry. Thus, unlike polishing, burnishing entails no chemical reaction. Material is removed solely by mechanical action. One type of edge burnishing machine is disclosed in U.S. Pat. No. 5,509,850. That machine includes a thin, flexible tape coated with abrasive particles that is rubbed against an edge of a wafer at varying elevational angles while being oscillated laterally. The tape rapidly removes material from the edge.

Burnishing machines offer the potential for significantly reduced-cost edge processing. Burnishing machines have a lower initial cost than edge polishing machines, and they avoid the expense of slurry and its handling and disposal complications. Burnishing can be performed much more rapidly than polishing, improving throughput between 50% and 100%.

However, burnishing an edge is only one step within a method for wafer processing and, in isolation, is insufficient to adequately smooth the edge. Although burnishing removes surface layers and eliminates large imperfections to afford some smoothing, it introduces new, smaller imperfections and damage. Specifically, any mechanically abrasive removal, as in burnishing, necessarily produces some damage because the abrasive is harder than the semiconductor material and high pressure is applied to obtain penetration and material removal. New microcracks and roughness due to burnishing are much smaller than previous damage, but nevertheless unacceptably large. A complete method for processing a wafer that includes edge burnishing, as well as other steps to produce an acceptably smooth wafer on the edge and the facial surfaces, has not been defined.

SUMMARY OF THE INVENTION

Among the several objects and features of the present invention may be noted the provision of a method for processing a peripheral edge of a semiconductor wafer that improves throughput in the preparation of wafers; the provision of a such a method that simplifies; the provision of such a method that smooths the edge without using a polishing slurry on the edge; and the provision of a method that reduces wafer processing costs.

In general, a method according to the present invention for processing a semiconductor wafer reduces surface roughness. The wafer has two flat, opposite faces with a peripheral edge extending around a circumference of the wafer between the faces. The method comprises, in the following order, the steps of burnishing the edge, and etching the edge. The step of burnishing is defined by a relative rubbing motion between the edge and an abrasive appliance to remove damage from the edge, the rubbing motion occurring free from any polishing solution or chemical slurry. The step of etching includes exposing the wafer to a liquid chemical etchant for a period of time to remove additional damage from the edge.

In another aspect, a method according to the present invention for processing a semiconductor wafer reduces surface roughness. The wafer has two flat, opposite faces with a peripheral edge extending around a circumference of the wafer between the faces. The method is an improvement to a method of a type having, in the following order, the steps of lapping at least one face of the wafer, etching the wafer by exposing the wafer to a liquid chemical etchant, conducting chemical-mechanical polishing of the peripheral edge of the wafer with a first polishing pad and a polishing slurry, and conducting chemical-mechanical polishing of the face of the wafer with a second polishing pad and a polishing slurry. The improvement comprises adding a step, after the step of lapping and prior to the step of etching, of burnishing the peripheral edge, and deleting the step of conducting chemical-mechanical polishing of the peripheral edge.

In yet another aspect, a method according to the present invention for processing a semiconductor wafer reduces surface roughness. The wafer has two flat, opposite faces and a peripheral edge extending around a circumference of the wafer between the faces. The method comprises, in the following order, the steps of lapping at least one face of the wafer to remove semiconductor matter through a relative rubbing motion between the face and an abrasive lapping plate in the presence of an abrasive liquid slurry. The peripheral edge of the wafer is burnished to remove semiconductor matter and embedded imperfections through a relative rubbing motion between the edge and an abrasive appliance, the rubbing motion occurring free from any polishing solution or chemical slurry. The wafer is etched to remove additional semiconductor matter and embedded imperfections by exposing the wafer to a liquid chemical etchant for a period of time.

Other objects and features of the present invention will be in part apparent and in part pointed out hereinafter.

DETAILED DESCRIPTION OF THE PREFERRED EMBODIMENT

Figure 2:
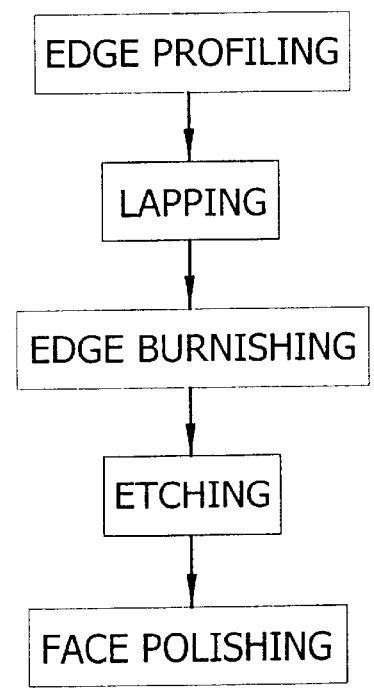
FIG. 2 is a flow diagram showing steps according to the present invention for processing the semiconductor wafer that include burnishing of the peripheral edge.

Referring now to the drawings and in particular to FIG. 2, a method for semiconductor wafer processing, including particularly a method for processing a peripheral edge of a wafer, is shown. The method smooths wafer surfaces and removes embedded imperfections to facilitate the installation of integrated circuit devices.

As is well known to those of ordinary skill in the art, a cylindrical, single crystal ingot of a semiconductor material, such as silicon, is commonly prepared using the so-called Czochralski process. In this process, polycrystalline silicon is melted in a crucible, a seed crystal is brought into contact with the molten silicon, and a single crystal silicon ingot is grown by slow extraction. The ingot is sliced, as by using a conventional inner diameter saw or wire saw apparatus. Each slice forms a thin, disk-shaped wafer having two flat, opposite facial surfaces and a peripheral edge extending around a circumference of the wafer between the faces. During the slicing operation, facial surfaces and the edge receive damage, including microcracks, chips, and roughness.

As shown on FIG. 2, the peripheral edge of the wafer is profiled. A grinding tool which carries abrasive material, such as diamond, grinds the edge to shape its contour. Sharp or square corners along the edge are rounded and a selected cross sectional profile is formed. The edge receives damage during this profiling operation, producing additional chips and roughness.

The wafer is lapped to remove semiconductor matter, improving uniformity of thickness and flatness. A conventional lapping operation uses an apparatus that simultaneously processes up to 25 wafers. The apparatus effects a relative rubbing motion between a set of rotating lapping plates and the face of the wafer in the presence of an abrasive liquid slurry, removing material and embedded damage by mechanical abrasion. Lapping may be totally or partially replaced by grinding without departing from the scope of the present invention.

Following lapping, the peripheral edge of the wafer is burnished to remove semiconductor matter, reducing surface roughness and embedded imperfections. Burnishing comprises rubbing a suitable abrasive appliance along the edge, the rubbing motion occurring free from any polishing solution or chemical slurry. Preferably, the step of burnishing is done using an edge burnishing machine of the type shown in U.S. Pat. No. 5,509,850. In practice, a machine found useful is a model NME-68N edge burnisher manufactured by Mipox International Corporation, having offices in Hayward, Calif. In that machine, the wafer is rotatably held in a generally horizontal orientation by a vacuum chuck. The abrasive appliance is a thin flexible tape, about three inches wide, that is coated with abrasive grit or particles. Tape having grit of a specific size may be selected, with available sizes ranging from at least 0.5 to 30.0 microns. The magnitude of resulting edge roughness is directly related to the abrasive grit size.

The abrasive tape is threaded inside the burnishing machine on a head that may vibrate generally along the circumference of the wafer and simultaneously rotate transverse to the edge, about an axis generally tangential to the circumference. The tape is simultaneously fed through the head between reels on the machine. Rotation of the head permits the tape to engage and burnish the edge over a range of relative angles corresponding with the cross sectional profile shape of the edge, so that the entire edge is uniformly burnished. Typically, the head presses the tape against the edge and cycles in rotation from a nominal position where the tape is vertically oriented, perpendicular to the wafer, to positions about 68° in either direction away from vertical. Rotation of the head occurs simultaneously with its vibration and with wafer rotation about its center. A stream of liquid water is typically provided to cool the wafer and eliminate abraded material, but there is no slurry with chemically active agents. In other words, there is no chemical present which reacts with the semiconductor material to cause its removal. The step of burnishing may be repeated once or several times with tapes of sequentially smaller grit size to reduce the size of edge damage and improve smoothness.

After burnishing, the wafer is etched as shown on FIG. 2 to remove additional semiconductor matter and embedded imperfections. Typically, a liquid etchant comprises an aqueous solution of nitric acid, hydrofluoric acid, phosphoric acid, and an oxidizing agent that produces a chemical reaction with silicon. The reaction removes damaged surface layers to yield improved gloss and smoothness. The wafer is preferably immersed in a bath of etchant for a period of time ranging from about 1 minute to about 10 minutes, and more preferably for about 2 to 3 minutes. As is commonly known to one skilled in the art, it is preferable that the etchant be continuously mixed or agitated for the duration of the etching process. The wafer may be rotated while immersed in the etchant to promote uniform etching across the surfaces of the wafer, which is especially preferable if the wafer is supported during etching by a wafer carrier that obstructs any portion of the wafer from exposure to etchant. Other forms of etching may be employed without departing from the scope of the present invention.

After the step of etching, chemical-mechanical polishing on at least one face of the wafer is conducted by effecting a relative rubbing motion between the face and a polishing pad in the presence of a polishing solution or chemical slurry. Polishing is one of the more expensive and time consuming steps in wafer manufacturing. To maximize throughput in the preparation of semiconductor wafers, a face polishing machine is preferably used to polish many wafers simultaneously. However, single wafer polishing is within the scope of the present invention. Polishing machines typically hold between 15 and 30 wafers in carriers that move relative to a rotating circular turntable, or platen, which is overlaid with a polishing pad. A stream of polishing solution, or slurry, is dispensed onto a surface of a pad while it is pressed against the wafers. During polishing, the wafer carriers and platen rotate in opposite directions for a predetermined time, a typical duration being 50 minutes.

After face polishing, the wafer is typically cleaned to remove any contaminants or residues from the wafer that may cause problems during electrical device fabrication. Various cleaning methods are commonly known to those skilled in the art. A preferable method of cleaning is to expose the wafer to ultrasonic waves while it is immersed in a liquid medium. The wafer is placed into a cleaning tank where it is immersed in a fluid containing a caustic solution, with or without a surfactant to assist in wetting and dispersing dirt. Ultrasonic waves emanating from wave generators located at the bottom of the cleaning tank are introduced into the liquid medium. Particles of grit or other contaminants on the wafer surfaces are removed by exposure to ultrasonic waves. The wafer is then put into a rinse tank where it is rinsed with deionized water, and then dried with isopropanol vapor. The cleaning operation readies the semiconductor wafer for further device manufacturing. The wafer is inspected and packaged into a conventional cassette container for transport or delivery, completing the preparation process.

Figure 1:
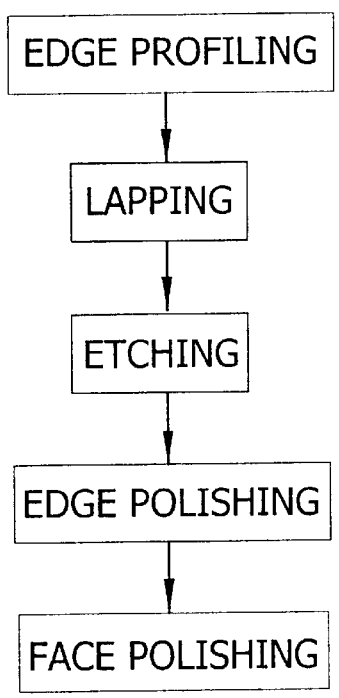
FIG. 1 is a flow diagram showing steps according to the prior art for processing a semiconductor wafer that include chemical-mechanical polishing of a peripheral edge.

Referring now to FIG. 1, a conventional method of wafer processing according to the prior art is shown. That method has the same initial steps of edge profiling and lapping. The next steps are, in sequence, etching, edge polishing, and face polishing. Thus in the prior art, smoothing of the edge occurs only after etching. The edge is treated essentially the same as the face (i.e., it is chemically-mechanically polished after the wafer is etched). Importantly, the method of the present invention shown in FIG. 2 is particularly constructed for avoiding the time and cost associated with edge polishing while maintaining high edge surface quality. The invention recognizes that the edge may be processed significantly differently than the face. Specifically, a step for smoothing the edge (burnishing) is conducted prior to etching.

In practice, the method according to the present invention has produced wafers having quality that is equivalent to those produced with conventional methods, while achieving substantial cost and time advantages. Under bright light visual inspection, edges appear equivalent in surface quality. Under inspection by microscope, the number of defects on edges that have been burnished and etched in the method of FIG. 2 is seen to be slightly greater than the number oh edges that have been polished in the method of FIG. 1. However, that difference is insignificant, and the yields achieved by the two methods are equivalent. The measured edge roughness is well within an acceptable range. Edge burnishing machines are significantly less expensive than a typical edge polisher. Burnishing does not require a polishing solution or chemical slurry, reducing operational expenses and precluding the need for environmental waste treatment and disposal for the edge processing portion of the method. The result is believed to be about a 60% reduction in processing cost per wafer. Operationally, the burnishing machine improves throughput because it has a capacity almost twice that of edge polishing machines. For instance, a typical edge polishing machine has a throughput of about 32 wafers per hour, whereas a burnishing machine achieves a throughput of about 70 wafers per hour.

In view of the above, it will be seen that the several objects of the invention are achieved and other advantageous results obtained.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A method of processing a new semiconductor wafer during manufacture of the wafer to reduce surface roughness, the wafer having two flat, opposite faces with a peripheral edge extending around a circumference of the wafer between the faces, the faces and the edge comprising exposed surfaces of a semiconductor material forming the wafer, the method comprising, in the following order, the steps of:

profiling the edge, the step of profiling including grinding the edge with an abrasive tool to form a selected edge cross-section shape, said profiling resulting in surface imperfections in the semiconductor material along the edge due to said grinding;

burnishing the edge, the step of burnishing defined by a relative rubbing motion between the edge and an abrasive appliance to accomplish removal of a portion of semiconductor material from the edge and thereby remove said surface imperfections in the semiconductor material along the edge resulting from profiling the edge, the rubbing motion occurring free from any polishing solution or chemical slurry; and etching the wafer, the step of etching including exposing the wafer to a liquid chemical etchant for a period of time to remove additional damage from the edge.

2. A method as set forth in claim 1 further comprising, after the step of etching, a step of chemical-mechanical polishing said at least one face of the wafer by effecting a relative rubbing motion between the face and a polishing pad in the presence of a polishing solution or chemical slurry.

3. A method as set forth in claim 2 further comprising, after the step of profiling and before the step of burnishing, a step of lapping at least one face of the wafer by effecting a relative rubbing motion between said at least one face and an abrasive lapping plate in the presence of an abrasive liquid slurry.

4. A method as set forth in claim 3 further comprising, after the step of chemical-mechanical polishing, a step of cleaning the wafer to remove any contaminants or residues from the wafer.

5. A method as set forth in claim 4 further comprising, after the step of cleaning the wafer, a step of packaging the wafer into a container for transport or delivery.

6. A method as set forth in claim 5 further comprising, before the step of profiling, a step of slicing a wafer from a single crystal semiconductor ingot.

7. A method as set forth in claim 1 wherein the step of burnishing the edge is conducted while the edge and the abrasive appliance are moved relative to each other within a range of relative angles.

8. A method as set forth in claim 7 wherein the step of burnishing the edge includes using for the abrasive appliance a thin flexible tape coated with abrasive particles.

9. In a method for processing a new semiconductor wafer during manufacture of the wafer to reduce surface roughness, the wafer having two flat, opposite faces with a peripheral edge extending around a circumference of the wafer between the faces, the faces and the edge comprising uncovered surfaces of a semiconductor material forming the wafer, the method of a type having, in the following order, the steps of:

lapping at least one face of the wafer;

etching the wafer by exposing the wafer to a liquid chemical etchant;

conducting chemical-mechanical polishing of the peripheral edge of the wafer with a first polishing pad and a polishing slurry; and conducting chemical-mechanical polishing of said at least one face of the wafer with a second polishing pad and a polishing slurry, the improvement comprising:

adding a step, after the step of lapping and prior to the step of etching, of burnishing the peripheral edge to accomplish removal of a portion of semiconductor material from the edge and thereby reduce surface roughness in the semiconductor material along the edge, and deleting the step of conducting chemical-mechanical polishing of the peripheral edge.

10. A method for processing a new semiconductor wafer during manufacture of the wafer to reduce surface roughness, the wafer having two flat, opposite faces, and a peripheral edge extending around a circumference of the wafer between the faces, the faces and the edge comprising uncovered surfaces of a semiconductor matter forming the wafer, the method comprising, in the following order, the steps of:

profiling the edge, the step of profiling including grinding the edge with an abrasive tool to form a selected edge cross-section shape; said profiling resulting in imperfections in the semiconductor matter along the edge;

lapping at least one face of the wafer to remove semiconductor matter through a relative rubbing motion between said at least one face and an abrasive lapping plate in the presence of an abrasive liquid slurry;

burnishing the peripheral edge of the wafer to remove semiconductor matter and embedded imperfections resulting from profiling through a relative rubbing motion between the edge and an abrasive appliance, the rubbing motion occurring free from any polishing solution or chemical slurry; and etching the wafer to remove additional semiconductor matter and embedded imperfections by exposing the wafer to a liquid chemical etchant for a period of time.

11. A method as set forth in claim 10 wherein the step of burnishing the edge is conducted while the edge and the abrasive appliance are moved relative to each other within a range of relative angles.

12. A method as set forth in claim 11 wherein the step of burnishing the edge includes using for the abrasive appliance a thin flexible tape coated with abrasive particles.

13. A method as set forth in claim 10 further comprising, after the step of etching, a step of chemical-mechanical polishing said at least one face of the wafer by effecting a relative rubbing motion between the face and a polishing pad in the presence of a polishing solution or chemical slurry.

14. A method as set forth in claim 13 further comprising, after the step of chemical-mechanical polishing, a step of cleaning the wafer to remove any contaminants or residues from the wafer.

15. A method as set forth in claim 14 further comprising, after the step of cleaning the wafer, a step of packaging the wafer into a container for transport or delivery.

16. A method as set forth in claim 15 further comprising, before the step of profiling, a step of slicing a wafer from a single crystal semiconductor ingot.

\* \* \* \* \*